(12) United States Patent
Park

(10) Patent No.: US 9,142,464 B1
(45) Date of Patent: Sep. 22, 2015

(54) METHOD FOR FABRICATING SEMICONDUCTOR APPARATUS

(71) Applicant: SK hynix Inc., Gyeonggi-do (KR)

(72) Inventor: Hae Chan Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/483,872

(22) Filed: Sep. 11, 2014

(30) Foreign Application Priority Data

May 30, 2014 (KR) .................. 10-2014-0066071

(51) Int. Cl.
| | |
|---|---|
| *H01L 21/425* | (2006.01) |
| *H01L 21/38* | (2006.01) |
| *H01L 21/84* | (2006.01) |
| *H01L 21/04* | (2006.01) |
| *H01L 21/8229* | (2006.01) |

(52) U.S. Cl.
CPC .......... *H01L 21/845* (2013.01); *H01L 21/0455* (2013.01); *H01L 21/8229* (2013.01)

(58) Field of Classification Search
CPC .............. H01L 21/041; H01L 21/0425; H01L 21/0257; H01L 21/0455; H01L 21/043; H01L 21/28088; H01L 21/845; H01L 21/475; H01L 21/2633; H01L 21/8229; H01L 21/76889; H01L 21/823835; H01L 23/345; H01L 23/53209; H01L 29/24; H01L 29/207
USPC ......... 438/510, 542, 501, 502, 540, 505, 508, 438/509, 530, 491, 495, 514, 520, 553, 581, 438/583, 591, 597; 257/E21.006, E21.045, 257/E21.046, E21.056, E21.058, E21.061, 257/E21.062, E21.077, E21.082, E21.13, 257/E21.135, E21.145, E21.152, E21.154, 257/E21.216, E21.218, E21.47, E21.593

See application file for complete search history.

(56) References Cited

U.S. PATENT DOCUMENTS

| | | | | |
|---|---|---|---|---|
| 7,776,715 B2 * | 8/2010 | Wells et al. | ................... | 438/455 |
| 8,258,057 B2 * | 9/2012 | Kuhn et al. | ................... | 438/637 |
| 8,766,372 B2 * | 7/2014 | Kuhn et al. | ................... | 257/388 |
| 8,906,775 B2 * | 12/2014 | Cho et al. | ...................... | 438/455 |

FOREIGN PATENT DOCUMENTS

KR 1020080111206 12/2008

* cited by examiner

*Primary Examiner* — David Nhu
(74) *Attorney, Agent, or Firm* — IP & T Group LLP

(57) ABSTRACT

A method for fabricating a semiconductor apparatus includes forming a diffusion barrier film on a semiconductor substrate, forming a semiconductor film on the semiconductor substrate in which the diffusion barrier film is formed, forming a silicide film on the semiconductor film, forming a conductive film on the silicide film, forming an upper portion of a pillar structure in a first region of the semiconductor substrate by patterning the conductive film, the silicide film, and the semiconductor film, forming a lower portion of the pillar structure by patterning the diffusion barrier film and the semiconductor substrate in the first region, and forming a gate electrode on an outer side of a patterned semiconductor substrate.

15 Claims, 6 Drawing Sheets

<CELL>  <PERI>

<CELL>  <PERI>

METHOD FOR FABRICATING SEMICONDUCTOR APPARATUS

CROSS-REFERENCES TO RELATED APPLICATION

This application claims priority under 35 U.S.C. 119(a) to Korean application No. 10-2014-0066071, filed on May 30, 2014, in the Korean intellectual property Office, which is incorporated by reference in its entirety as set forth in full.

BACKGROUND

1. Technical Field

Various embodiments of the inventive concept relate to a method for fabricating a semiconductor apparatus having a vertical channel.

2. Related Art

Transistors, which are typical elements in semiconductor devices, include a gate, a source, and a drain. Transistors having two-dimensional (2D) structures may include a gate formed on a semiconductor substrate, and a source and a drain formed by doping the semiconductor substrate at both sides of the gate with impurities. The region between the source and the drain becomes the channel region of the transistor. The channel length of the transistor has a limit on how much its size can be reduced based on the linewidth of the gate. When the channel length is reduced below the limit, phenomena such as a short channel effect may occur that limit the ability of the transistor to properly function.

To overcome these limitations, vertical channel semiconductor devices have been used. In the vertical channel semiconductor devices, an active region is formed in a pillar form, and a source and a drain are located in lower and upper portions of the pillar to form the vertical channel, which is perpendicular to the surface of the semiconductor substrate.

In vertical channel semiconductor devices, a gate is extended in a line surrounding the pillar or in contact with either side of the pillar.

However, as the above-described vertical channel semiconductor devices are scaled down, there is increased fabrication difficulty. In particular, it is difficult to control the contact resistance between a vertical channel transistor and a lower electrode in a semiconductor device having a linewidth below 20 nm. Thus, there is a need for a method for fabricating semiconductor devices having stable contact resistance.

SUMMARY

An embodiment of the present invention is a method for fabricating a semiconductor apparatus. The method may include forming a diffusion barrier film on a semiconductor substrate, forming a semiconductor film on the semiconductor substrate on which the diffusion barrier film is formed, forming a silicide film on the semiconductor film, forming a conductive film on the silicide film, forming an upper portion of a pillar structure in a first region of the semiconductor substrate by patterning the conductive film, the silicide film, and the semiconductor film, forming a lower portion of the pillar structure by patterning the diffusion barrier film and the semiconductor substrate in the first region, and forming a gate electrode on an outer side of a patterned semiconductor substrate.

A second embodiment of the present invention is a method for fabricating a semiconductor apparatus. The method may include sequentially forming a diffusion barrier film and a semiconductor film on a semiconductor substrate, forming a silicide film on the semiconductor film, forming a conductive film for an electrode on the silicide film, forming a pillar structure by patterning the conductive film, the silicide film, the semiconductor film, the diffusion barrier film, and patterning the semiconductor substrate to a predetermined depth, and forming a gate electrode surrounding an outer circumference of a patterned semiconductor substrate with a predetermined height.

These and other features, aspects, and embodiments are described below in the section entitled "DETAILED DESCRIPTION".

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Figure 1:
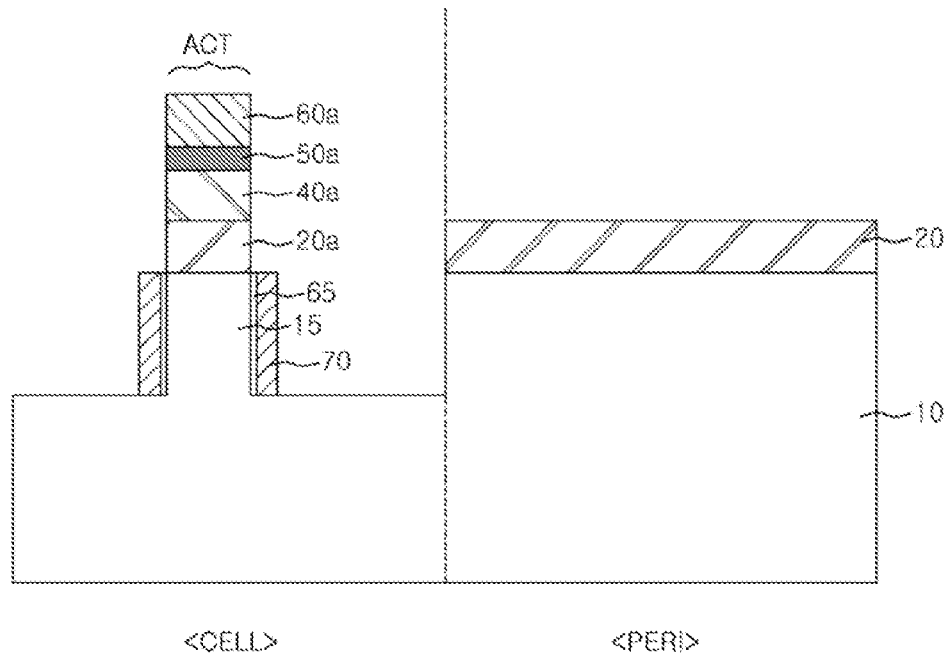
FIG. 1 is a cross-sectional view illustrating a semiconductor apparatus according to an embodiment of the inventive concept.

Exemplary embodiments will be described in greater detail with reference to the accompanying drawings. Variations from the shapes of the illustrations as a result, for example, of manufacturing techniques and/or tolerances, are to be expected. Thus, embodiments should not be construed as limited to the particular shapes illustrated herein but may include deviations in shapes that result, for example, from manufacturing. In the drawings, lengths and sizes of layers and regions may be exaggerated for clarity. Like reference numerals in the drawings denote like elements. When a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form, and vice versa, as long as it is not specifically mentioned.

Embodiments of the inventive concept should not be construed as limiting, but rather illustrative. Although a few embodiments of the inventive concept will be shown and described, it will be appreciated by those of ordinary skill in the art that changes may be made to these exemplary embodiments without departing from the principles and spirit of the inventive concept.

Referring to FIG. 1, a semiconductor apparatus according to an embodiment of the inventive concept may include a semiconductor substrate 10 having a pillar 15, a gate electrode 70 surrounding a lateral surface of the pillar 15, and a diffusion barrier layer 20a, a semiconductor layer 40a, an ohmic contact layer 50a, and a first electrode layer 60a sequentially stacked on a top surface of the pillar 15.

The diffusion barrier layer 20a may be formed of an undoped polysilicon material, and the semiconductor layer 40a may be formed of a doped polysilicon material. Preferably, the semiconductor layer 40a is may be formed of a material having the same conductivity type as a common source region to be formed in the semiconductor substrate 10.

The diffusion barrier layer 20a is formed between the semiconductor layer 40a and the pillar 15 to prevent impurities in the semiconductor layer 40a, which is formed of a doped polysilicon material, from being diffused to the pillar 15 used for a channel region.

The pillar 15, the ohmic contact layer 50a, the first electrode layer 60a, and the gate electrode 70 have known structures, and thus a detailed description thereof will be omitted. The first electrode layer 60a may be a lower electrode of a variable resistive memory device.

The reference numeral 65 denotes a gate insulating layer located between the pillar 15 and the gate electrode 70.

Hereinafter, a method for fabricating a semiconductor apparatus according to an embodiment of the inventive concept will be described in detail with reference to FIGS. 2 to 9.

Figure 2:
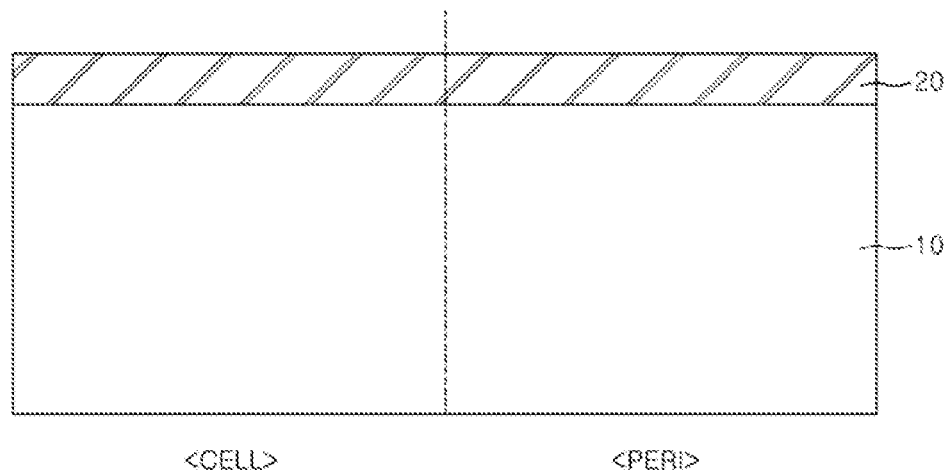
FIGS. 2 to 9 are cross-sectional views illustrating a method for fabricating a semiconductor apparatus according to an embodiment of the inventive concept.

Referring to FIG. 2, a semiconductor substrate 10 including a cell region CELL and a peripheral region PERI is provided. The semiconductor substrate 10 may include a common source region (not shown) having a predetermined depth and formed on an upper surface thereof. The common source region may be formed through Implantation of a certain impurity, for example, an $N^+$ type impurity. Further, the common source region may be formed after a pillar structure (to be described later) is formed.

A diffusion barrier film 20 is formed on the semiconductor substrate 10. The diffusion barrier film 20 may be formed of an undoped polysilicon material.

Figure 3:
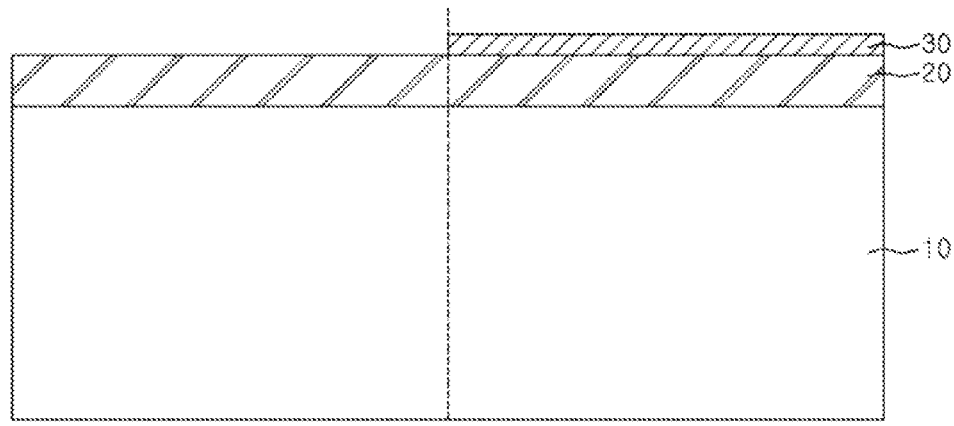

Referring to FIG. 3, a sacrificial film 30 is formed only on the peripheral region of the semiconductor substrate 10 in which the diffusion barrier film 20 is formed. The sacrificial film 30 is formed to control impurities which may diffuse to the peripheral region when a semiconductor film (see 40 of FIG. 4) is formed in a subsequent process. The sacrificial film 30 may include a titanium nitride (TiN) film, but the material for the sacrificial film 30 is not limited thereto.

Figure 4:
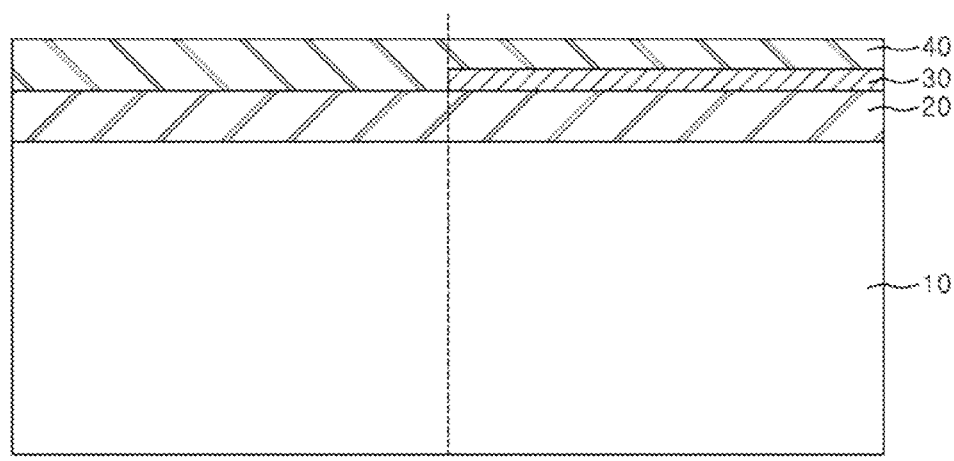

Referring to FIG. 4, the semiconductor film 40 is formed on the semiconductor substrate in which the sacrificial film 30 is formed. The semiconductor film 40 may be formed of a material having the same conductivity type as the common source region. For example, when the common source region is formed through the implantation of the $N^+$ type impurity as described above, the semiconductor film 40 may also be doped with $N^+$ type impurities. Preferably, the semiconductor film 40 may be formed of a doped polysilicon material.

Figure 5:
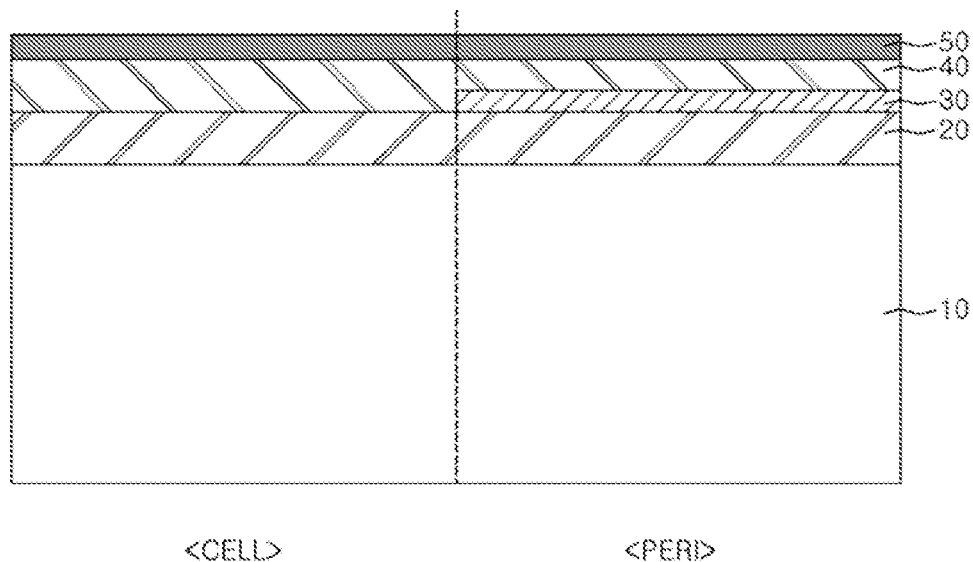

Referring to FIG. 5, a silicide film 50 is formed on the semiconductor film 40. The silicide film 50 may be formed through a series of processes of forming a transition metal material (not shown) on the semiconductor film 40, performing a heat treatment for reacting the transition metal material with the semiconductor film 40, and removing the transition metal material left after the heat treatment.

Figure 6:
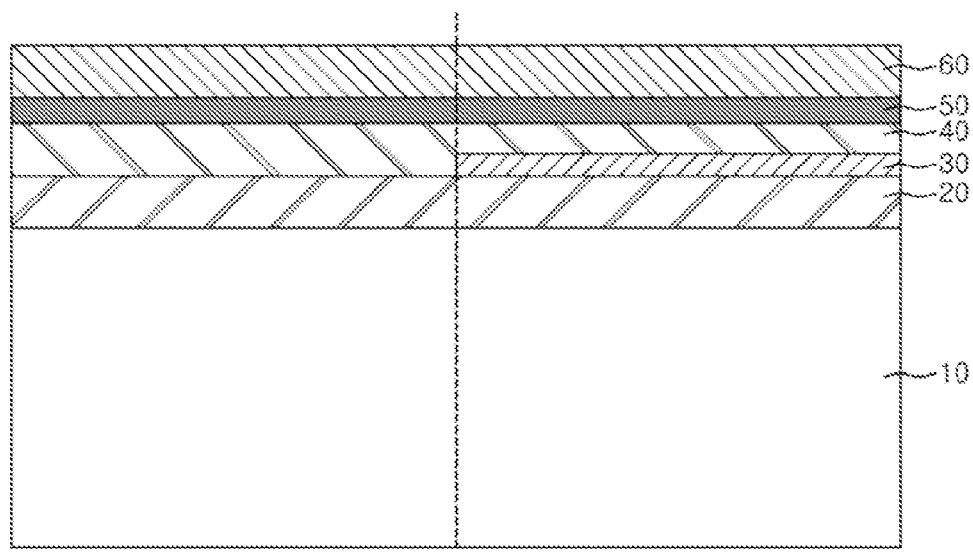

Referring to FIG. 6, a conductive film 60 is formed on the silicide film 50. The conductive film 60 may include a TiN film, but the material for the conductive film 60 is not limited thereto. The conductive film 60 may be used as a lower electrode in a variable resistive memory device.

Figure 7:
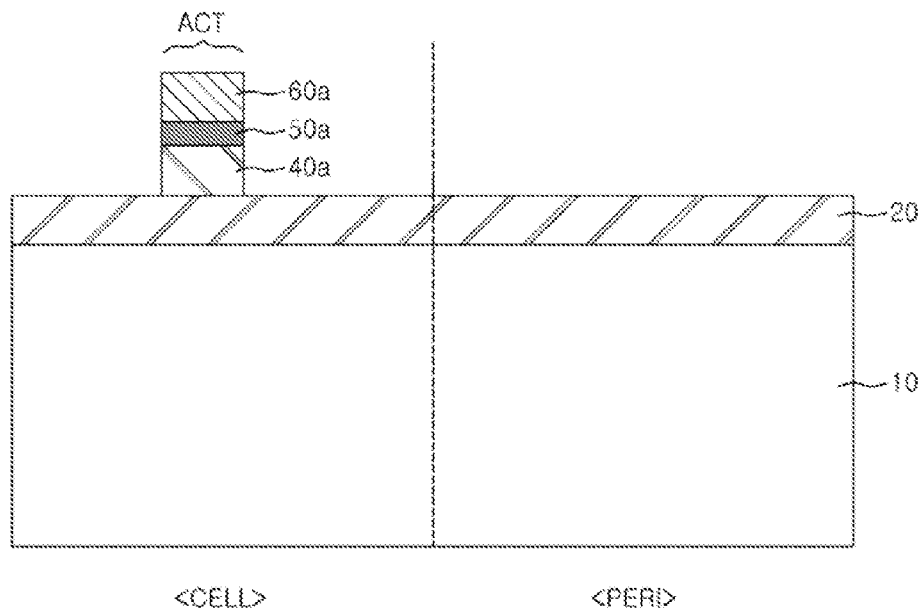

Referring to FIG. 7, an active region ACT in which a vertical channel transistor is to be formed, that is, an upper portion of a pillar structure is defined. The active region ACT may be defined by forming a hard mask (not shown) on the active region ACT, and patterning the conductive film 60, the silicide film 50, the semiconductor film 40, and the sacrificial film 30 using the hard mask. Through the above-described process, a semiconductor layer 40a, an ohmic contact layer 50a, and a first electrode layer 60a of the embodiment may be formed.

Figure 8:
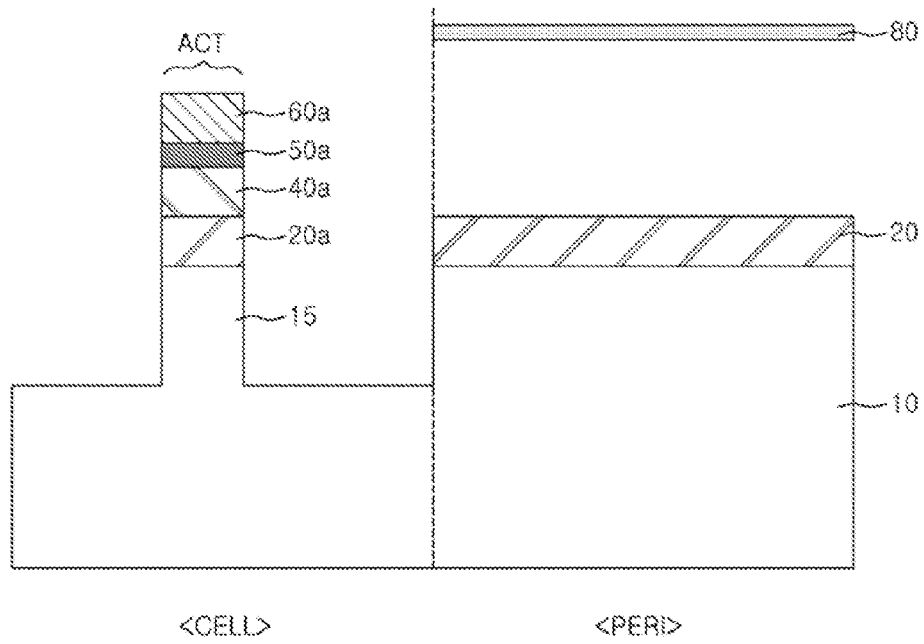

Referring to FIG. 8, a peri close mask 80 is formed on the peripheral region. Using the peri close mask 80 and the first electrode layer 60a, the diffusion barrier film 20 of the cell region other than the active region ACT is removed, and a portion of the semiconductor substrate 10 is recessed. Through the process, a pillar 15 and a diffusion barrier layer 20a of the embodiment may be formed.

Figure 9:
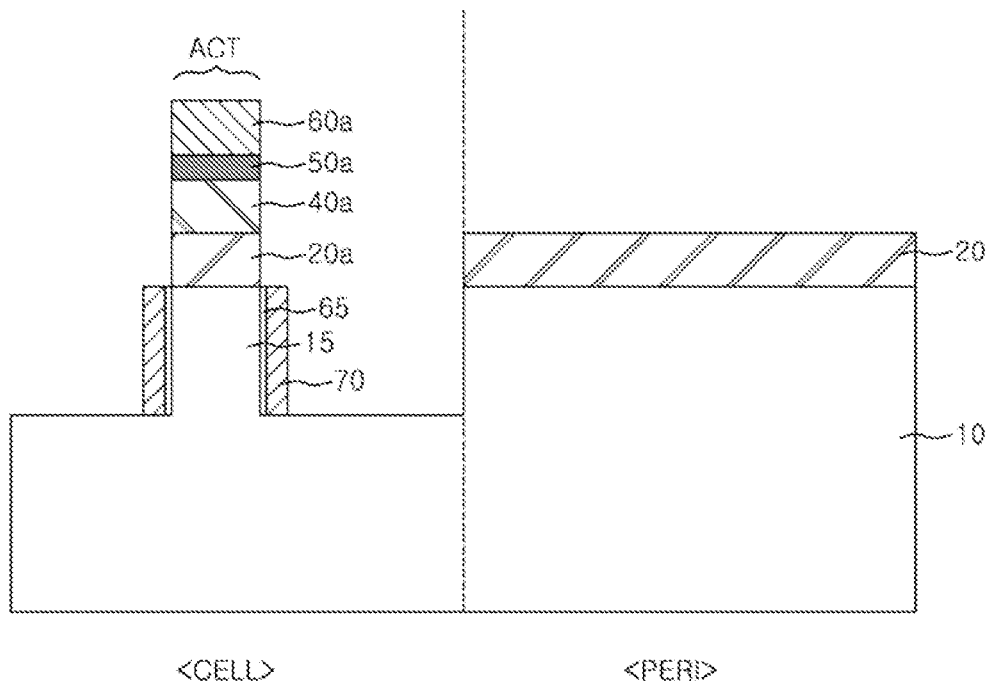

Referring to FIG. 9, a gate insulating film 65 is formed to surround a lateral surface of the pillar 15, and a gate electrode 70 is formed to surround a lateral surface of the gate insulating film 65.

The gate electrode 70 may be formed by gap-filling the cell region with a conductive material (not shown), spacer-etching the conductive material, and etching back the spacer-etched conductive material substantially to have the same height as a top surface of the pillar 15. The gate electrode 70 may include a TiN layer, but the material for the gate electrode 70 is not limited thereto.

Although not shown in drawings, a variable resistance layer (not shown) and a second electrode layer (not shown) may be formed on the first electrode layer 60a to complete the semiconductor apparatus, for example, a variable resistive memory device. An insulating film (not shown) is gap-filled in the cell region other than the regions of the pillar structure including the pillar 15, the diffusion barrier layer 20a, the semiconductor layer 40a, the ohmic contact layer 50a, and the first electrode layer 60a, the variable resistance layer, the second electrode layer, and the gate electrode 70. The process of gap-filling the insulating film is known technology, and thus a detailed description thereof will be omitted.

Hereinafter, a method for fabricating a semiconductor apparatus according to another embodiment of the inventive concept will be described in detail with reference to FIGS. 10 to 12.

Figure 10:
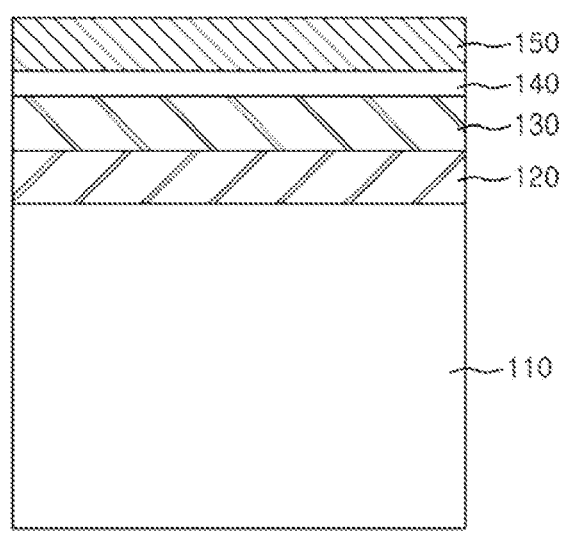
FIGS. 10 to 12 are cross-sectional views illustrating a method for fabricating a semiconductor apparatus according to another embodiment of the inventive concept

Referring to FIG. 10, a diffusion barrier film 120, a semiconductor film 130, a silicide film 140, and a conductive film 150 are sequentially formed on a semiconductor substrate 110.

The diffusion barrier film 120 may be formed of an undoped polysilicon film.

The semiconductor film 130 may include a semiconductor film having the same conductivity type as a common source region. For example, the semiconductor film 130 may be formed of a doped polysilicon film.

The silicide film 140 may be formed through a series of processes of forming a transition metal material (not shown) on the semiconductor film 130, performing a heat treatment for reacting the transition metal material with the semiconductor film 130, and removing the transition metal material left after the heat treatment.

The conductive film 150 may be used as a lower electrode in a variable resistive memory device. The process of forming the conductive film 150 is known technology, and thus a detailed description thereof will be omitted.

Figure 11:
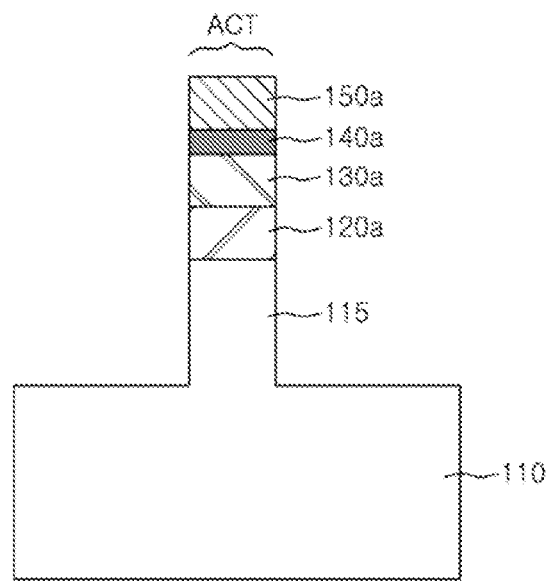

Referring to FIG. 11, an active region ACT is defined by patterning the conductive film 150, the silicide film 140, the semiconductor film 130, the diffusion barrier film 120, and a portion of the semiconductor substrate 110 to a predetermined depth. Through the process of defining the active region ACT, a pillar structure including a pillar 115, a diffusion barrier layer 120a, a semiconductor layer 130a, an ohmic contact layer 140a, and a first electrode layer 150a may be formed on the semiconductor substrate 110.

A common source region may be formed by implanting impurities into the semiconductor substrate 110 after the pillar structure is completed. The process of forming the common source region may be performed before the diffusion barrier film 120 is formed on the semiconductor substrate 110.

Figure 12:
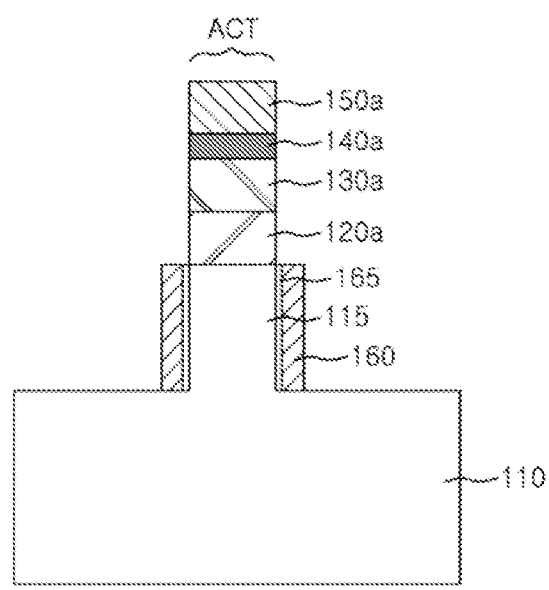

Referring to FIG. 12, a gate insulating film 165 is formed to surround a lateral surface of the pillar 115, and a gate electrode 160 is formed to surround a lateral surface of the gate insulating film 165.

The gate electrode 160 may be formed by gap-filling the semiconductor substrate, in which the pillar structure is formed, with a conductive material (not shown), spacer-etching the conductive material, and etching back the spacer-etched conductive material substantially to have the same height as a top surface of the pillar 115.

Although not shown in drawings, a variable resistance layer (not shown) and a second electrode layer (not shown) may be formed on the first electrode layer 150a to complete the semiconductor apparatus, for example, a variable resistive memory device.

As described above, according to the embodiment of the inventive concept, a semiconductor layer is formed through a series of processes of forming a pillar structure by sequentially forming a diffusion barrier film, a semiconductor film, a transition metal film, and a conductive film on a semiconductor substrate, and patterning the conductive film, the transition metal film, the semiconductor film, and the diffusion barrier film, and the semiconductor substrate, and the semiconductor layer is used as a drain. Therefore, the contact resistance of the drain may be easily controlled since the drain is not formed through ion implantation of impurities into an upper portion of the pillar.

According to the embodiment of the inventive concept, the pillar structure is formed by sequentially forming the diffusion barrier film, the semiconductor film, the transition metal film, and the conductive film on a semiconductor substrate, and patterning the conductive film, the transition metal film, the semiconductor film, and the diffusion barrier film, and thus the conductive film used as a lower electrode is formed on a flat plate. Therefore, the lower electrode may be formed to have a stable contact resistance without defects such as seams.

According to the embodiment of the inventive concept, the diffusion barrier layer and the semiconductor layer are formed of an undoped polysilicon material and a doped polysilicon material, respectively, on the pillar, and thus diffusion of impurities to the pillar may be prevented even when the height of the semiconductor layer is not large.

The above embodiment of the present invention is illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A method for fabricating a semiconductor apparatus, the method comprising:
   forming a diffusion barrier film on a semiconductor substrate;
   forming a semiconductor film on the semiconductor substrate on which the diffusion barrier film is formed;
   forming a silicide film on the semiconductor film;
   forming a conductive film on the silicide film;
   forming an upper portion of a pillar structure in a first region of the semiconductor substrate by patterning the conductive film, the silicide film, and the semiconductor film;
   forming a lower portion of the pillar structure by patterning the diffusion barrier film and the semiconductor substrate in the first region; and
   forming a gate electrode on an outer side of a patterned semiconductor substrate.

2. The method of claim 1, further comprising:
   forming a source in the semiconductor substrate, after the forming of the lower portion of the pillar structure,
   wherein the semiconductor film has the same conductivity type as the source.

3. The method of claim 1, wherein the diffusion barrier film includes an undoped polysilicon film.

4. The method of claim 3, wherein the semiconductor film includes a doped polysilicon film.

5. The method of claim 4, wherein the semiconductor film functions as a drain.

6. The method of claim 1, further comprising:
   forming a sacrificial film on a second region other than the first region of the semiconductor substrate in which the diffusion barrier film is formed, after the forming of the diffusion barrier film.

7. The method of claim 6, wherein the forming of the semiconductor film includes forming the semiconductor film on the diffusion barrier film of the first region and the sacrificial film of the second region, and
   the forming of the upper portion of the pillar structure includes patterning the sacrificial film in the second region.

8. The method of claim 1, wherein the forming of the lower portion of the pillar structure includes:
   forming a peri close mask on a second region other than the first region of the semiconductor substrate; and
   patterning the diffusion barrier film and a portion of the semiconductor substrate in the first region to a predetermined depth using the peri close mask and a patterned conductive film.

9. The method of claim 1, wherein the forming of the gate electrode includes:
   forming a gate insulating film on an outer circumference of the patterned semiconductor substrate;
   forming a conductive material on the semiconductor substrate in which the gate insulating film is formed;
   spacer-etching the conductive material, resulting in a spacer-etched conductive material, to be formed on an outer circumference of the gate insulating film; and
   etching back the gate insulating film and the spacer-etched conductive material to have substantially the same height as a top surface of the patterned semiconductor substrate.

10. The method of claim 1, wherein the first region of the semiconductor substrate includes a cell region while a second region other than the first region of the semiconductor substrate includes a peripheral region.

11. A method for fabricating a semiconductor apparatus, the method comprising:
   sequentially forming a diffusion barrier film and a semiconductor film on a semiconductor substrate;
   forming a silicide film on the semiconductor film;
   forming a conductive film for an electrode on the silicide film;
   forming a pillar structure by patterning the conductive film, the silicide film, the semiconductor film, and the diffusion barrier film, and patterning the semiconductor substrate to a predetermined depth, resulting in a patterned semiconductor substrate; and forming a gate electrode surrounding an outer circumference of the patterned semiconductor substrate.

12. The method of claim 11, further comprising:
forming a source in the semiconductor substrate, after the forming of the pillar structure,
wherein the semiconductor film has the same conductivity type as the source.

13. The method of claim 11, wherein the diffusion barrier film includes an undoped polysilicon film.

14. The method of claim 13, wherein the semiconductor film includes a doped polysilicon film.

15. The method of claim 14, wherein the semiconductor film functions as a drain.

* * * * *